(12) United States Patent
Arnborg et al.

(10) Patent No.: US 6,884,703 B2
(45) Date of Patent: Apr. 26, 2005

(54) MANUFACTURING OF A LOW-NOISE MOS DEVICE

(75) Inventors: Torkel Arnborg, Stockholm (SE); Ted Johansson, Djursholm (SE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/756,728

(22) Filed: Jan. 13, 2004

(65) Prior Publication Data

US 2004/0161914 A1 Aug. 19, 2004

Related U.S. Application Data

(63) Continuation of application No. PCT/SE02/01380, filed on Jul. 12, 2002.

(30) Foreign Application Priority Data

Jul. 13, 2001 (SE) ................................................ 0102526

(51) Int. Cl.⁷ ............................................ H01L 21/425
(52) U.S. Cl. ....................... 438/514; 438/517; 438/522; 438/531
(58) Field of Search ................................ 438/514, 517, 438/522, 531

(56) References Cited

U.S. PATENT DOCUMENTS

| 5,330,920 A | 7/1994 | Soleimani et al. ............ 437/24 |
| 6,136,674 A | 10/2000 | An et al. ..................... 438/585 |
| 6,335,262 B1 | 1/2002 | Crowder et al. ............ 438/440 |
| 6,734,085 B1 * | 5/2004 | Cho et al. ................... 438/514 |

* cited by examiner

*Primary Examiner*—Michael Tran
*Assistant Examiner*—Renee R. Berry
(74) *Attorney, Agent, or Firm*—Baker Botts L.L.P.

(57) ABSTRACT

At the surface of a substrate a gate oxide layer is produced and is given a dual thickness. A first oxide layer is produced over the surface of a substrate by thermal oxidation and is covered by a mask layer defining suitably located openings. A material accelerating or retarding the oxidation of the substrate is ion implanted through the first oxide layer in the openings, after which the mask is removed and the thermal oxidation is continued over the now exposed total surface of the first oxide layer. The material used for ion implanting can be an oxidation rate promoting material such as chloride and bromine. The manufacturing method is simple and adds little to presently used process flows for fabricating MOS devices. The dual thickness of the gate oxide gives the manufactured MOS device a low level of total noise generated when using the device for instance in RF-circuits.

12 Claims, 3 Drawing Sheets

US 6,884,703 B2

MANUFACTURING OF A LOW-NOISE MOS DEVICE

CROSS REFERENCE TO RELATED APPLICATION

This application is a continuation of copending International Application No. PCT/SE02/01380 filed Jul. 12, 2002 which designates the United States, and claims priority to Swedish application no. 0102526-1 filed Jul. 13, 2001.

TECHNICAL FIELD OF THE INVENTION

The present invention is related to manufacture of a low noise MOS transistor of interest in CMOS Radio Frequency Integrated Circuit (RF-IC) applications where the noise performance for low-voltage devices is important.

DESCRIPTION OF THE RELATED ART

The total noise in any Radio Frequency (RF) circuit is a combination of noise created by different physical phenomena at different locations, see e.g. Chapter 6 in C. D. Motchenbacher, J. A. Connelly, "Low-Noise Electronic System Design", Wiley, 1997. Usually the dominant noise source is found in the active semiconductor devices. As a result of the continuing downscaling of the devices, most of the noise sources of a transistor tend to increase. For MOS transistors, a very important source is the hot carrier noise in the channel. This type of noise has its origin in the velocity distribution of the electric charge carriers, see L. M. Franca-Neto, E. Mao, J. S. Harris Jr., "Low Noise FET Design for Wireless Communications", 1997 IEDM Tech. Digest, p. 305, and Luiz M. Franca-Neto, "Noise in High Electric Field Transport and Low Noise Field Effect Transistor Design: The Ergodic Method", Ph.D. thesis, Stanford University, USA, May 1999. If all carriers would move with equal velocity, this kind of noise would be zero. However, this never happens and in a real transistor the carriers scatter with various particles like phonons and photons giving a non-uniform velocity distribution.

Most efforts to reduce noise in RF-IC:s are related to the circuit design and selection of appropriate impedance levels to minimize noise. For minimization of noise created in the device itself, a number of known device and process design tricks can be used, but most of them are not addressing problem of the hot-carrier noise and the most common bias situations. Measurements on Lightly Doped Drain (LDD) MOS transistors have shown that they have lower noise than non-LDD devices.

It has also been shown in the article by Luiz M. Franca-Neto cited above that built-in strain in semiconductor layers could be used to affect electrical properties in a way that could reduce noise. In both cases the electric field variations along the channel have been reduced to narrow the carrier velocity distribution profile.

LDD transistors have been extensively used with success to improve breakdown voltage. These devices were designed to minimize the electrical field at the drain junction to avoid the peak electric field that causes the main hot carrier generation which may give subthreshold currents, threshold voltage drifts, and in a worst case a destructive break-down. The doping profile in the LDD structure can only modify a small fraction of the channel and will not narrow down the velocity distribution as much as would be desired to substantially reduce the carrier noise.

MOS transistors having a gate oxide thickness that is non-uniform have lower noise resulting in better noise figures when used in amplifiers. However, it is practically difficult to obtain a true gradually non-uniform oxide, but a good compromise includes devices having two or three different gate oxide thicknesses. In the documents briefly discussed below various MOS devices having a non-uniform or asymmetric gate oxide thickness are disclosed, where different more or less complex methods are used for the fabrication thereof.

In U.S. Pat. No. 5,741,737 an MOS device is disclosed having improved device performance achieved by a ramped gate oxide thickness. In the method used for achieving the dual gate oxide thicknesses a portion of the gate is covered by a mask before continuing the oxidation thereof to produce a thicker gate oxide layer. In U.S. Pat. No. 6,080,682 a method is disclosed in which a nitride layer is etched to form an opening, and then in the opening a nitrogen-rich region is created by exposure to e.g. a $NH_3$-plasma. The nitride layer is removed and finally, oxide is thermally grown, the growth being retarded in the remaining nitrogen-rich layer. A similar method is disclosed in U.S. Pat. No. 5,918,133. In the method disclosed in U.S. Pat. No. 6,048,759 a thick oxide layer is selectively etched to provide thinner portions. In U.S. Pat. No. 5,422,505 a method of forming a gate oxide having several thicknesses is disclosed including that a first thin oxide layer is formed, the thin oxide layer is selectively removed and then oxidation of the left portions of the thin layer is continued together with new oxidation in regions where it has been removed. In the method described in U.S. Pat. No. 6,124,171 an oxide layer is protected by a nitride mask, the two layers are patterned, nitride and oxide are removed in the openings and then another oxide layer is produced there which can be thinner or thicker than the first one. In U.S. Pat. Nos. 6,121,666 and 6,110,783 an improved MOS device having a "split gate" oxide is disclosed.

In U.S. Pat. Nos. 6,066,535 and 6,127,235 similar methods of producing an asymmetrical gate oxide thickness are described. In U.S. Pat. No. 6,037,224 an alternative of etching for making a dual thickness device is disclosed. A dual thickness oxide layer is formed on a silicon substrate by forming a gate oxide layer and converting a sublayer of the layer to an oxygen diffusion barrier. The layer is then patterned to expose areas of the substrate which are oxidized to form a second oxide layer adjacent the first oxide layer but of different thickness.

SUMMARY OF THE INVENTION

It is an object of the invention to provide a simple method of manufacturing a dual thickness MOS device having a low level of the total noise.

This object can be achieved by a method of fabricating a low noise MOS transistor at and/or in the surface of a substrate comprising the step of producing a dual thickness gate oxide layer with the steps:

producing a first oxide layer over the surface of a substrate by thermal oxidation, covering the first oxide layer with a mask layer, patterning the mask layer to form at least one opening, ion implanting a material accelerating or retarding the oxidation of the material of the substrate through the first oxide layer in the opening, removing the mask, and continuing the thermal oxidation over the now exposed total surface of the first oxide layer.

Furthermore, the method may comprise the step of producing a gate located on top of the gate oxide layer and the step of producing a source and a drain located at/in the surface of the substrate and at sides of the gate oxide region.

The object can also be achieved by a method of fabricating a low noise MOS transistor at and/or in the surface of a substrate comprising the steps of, performed in any suitable order:

producing a gate oxide layer in a gate oxide region at/in the surface of the substrate and having a dual thickness comprising the substeps:

producing a first oxide layer over the surface of a substrate by thermal oxidation, covering the first oxide layer with a mask layer, patterning the mask layer to form at least one opening, ion implanting a material accelerating or retarding the oxidation of the material of the substrate through the first oxide layer in the opening, removing the mask, and continuing the thermal oxidation over the now exposed total surface of the first oxide layer, producing a gate located on top of the gate oxide layer, and producing a source and a drain located at/in the surface of the substrate and at sides of the gate oxide region.

The material used for ion implanting can be an oxidation rate promoting material chosen from the group of chloride and bromine. In the substep of patterning the mask layer openings can be formed covering marginal regions of a gate region in which the gate is to be formed, a region inside the gate region being still covered with the mask layer. The material used for ion implanting may comprise nitrogen. In the substep of patterning the mask layer an opening can be formed inside a gate region in which the gate is to be formed, marginal regions of the gate region being still covered by the mask layer.

Thus, for manufacturing an MOS transistor generally the conventional steps of producing a gate oxide layer in a gate oxide region, a source and a drain at the surface of a substrate and a gate located on top of the gate oxide layer are performed, these steps executed in any suitable order. For producing a gate oxide layer having a dual thickness first a thin oxide layer is produced over a portion of the surface of a substrate, preferably by thermal oxidation. A mask layer is applied over the oxide layer and is patterned to form an opening or openings. Then, through the oxide layer in the opening or openings, a material accelerating or retarding the rate of oxidation of the material of the substrate is ion implanted. The mask is thereafter removed, and finally the thermal oxidation over the now totally exposed surface of the thin oxide layer is continued. In the implanted region the oxide layer now formed will be thicker or thinner than the rest of the oxide layer due to the effect of the implanted material.

The fabrication method has a low complexity and only adds a minimum of processing steps to conventionally used methods of fabricating MOS devices.

The fabricated MOS has low carrier noise owing to the dual gate oxide thickness.

Additional objects and advantages of the invention will be set forth in the description which follows, and in part will be obvious from the description, or may be learned by practice of the invention.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIGS. 2a–2g are schematic cross-sectional views illustrating steps performed in fabrication of an MOS transistor having two different gate oxide thicknesses, using photolithography and etching, in which FIG. 2a shows a starting material, FIG. 2b shows growth of initial gate oxide and mask alignment, FIG. 2c shows gate oxide which has been etched and a photoresist mask that has been removed, FIG. 2d shows the continued growth of gate oxide, FIG. 2e shows the deposition of gate polysilicon, FIG. 2f shows the structure after patterning and etching of gate polysilicon, where the photoresist has not yet been removed, FIG. 2g shows source/drain/gate doping by As implantation.

DETAILED DESCRIPTION OF THE PREFERRED EMBODIMENTS

Figure 1:
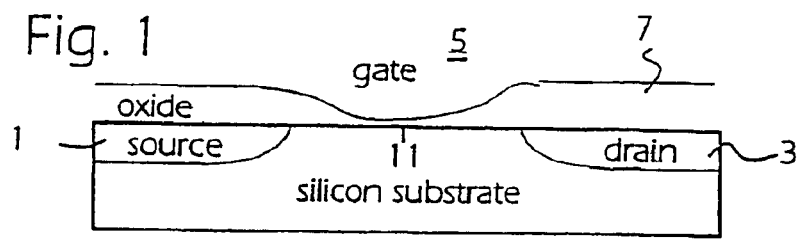
FIG. 1 is a schematic cross-sectional view of an MOS transistor having a non-uniform oxide thickness.

In FIG. 1 a cross-section of an MOS transistor is shown having a source 1, a drain 3, a gate 5 and gate oxide 7 located in or at the surface of a silicon substrate 9. Beneath the gate 5 a channel 11 is created in the substrate. Along the first part of the channel 11 the thickness of the gate oxide is decreasing and along the last part of the channel the thickness of the gate oxide is increasing. In the beginning of the channel strong inversion conditions exist in which the carriers move close to the silicon-oxide interface. The continuity condition of the carrier transport defines the potential distribution according to the gradual channel approximation, see e.g. Chapter 8 in S. M. Sze, "Physics of Semiconductor Devices", 2nd ed., Wiley, 1981. However, this gives an electric field parallel to the channel that is low at the source side and increasing towards the drain. By increasing the oxide thickness at the source side the transverse electric field is reduced giving a smaller inversion charge density. In order to fulfil the continuity condition, the parallel field and the carrier velocity must increase. This effect gives a more uniform longitudinal field distribution along the channel and the carrier velocity distribution has smaller variations than in a standard MOS transistor.

For a typical bias of the MOS transistor with a gate potential somewhere between the potentials of source and drain, potential pinch off will occur in the channel 11. A small oxide thickness towards the drain 3 will reduce high voltage degradation and has a second order influence on the carrier transport. It is thus possible and beneficial to let the oxide thickness increase again towards the drain.

Methods of producing an MOS transistor having two different gate oxide thicknesses will now be described in conjunction with specific examples, the produced transistors having a reduced noise level and thereby better general performance.

EXAMPLE 1

Fabrication of an MOS transistor using etching to produce two different gate oxide thicknesses will now be described with reference to the schematic cross-sectional views of FIGS. 2a–2g, the production of the dual gate oxide thicknesses being made substantially in the same way as described in the cited U.S. Pat. No. 5,422,505. The device can typically be a 0.5 μm MOS transistor having a gate oxide thickness of 80 and 120 Å The limit will be set by the photolithography in the step illustrated in FIG. 2b, mainly the dimension of the mask relative to the gate length, i.e. to the mask pattern shown in FIG. 2f. The process sequence utilizes no new process steps; all are available in a conventional CMOS process flow. The steps illustrated in FIGS. 2b and 2c have been added to obtain the MOS transistor, these steps including in total the applying of one additional photo mask, one lithographic step, one dry etching step and one gate oxidation step.

Figure 2A:
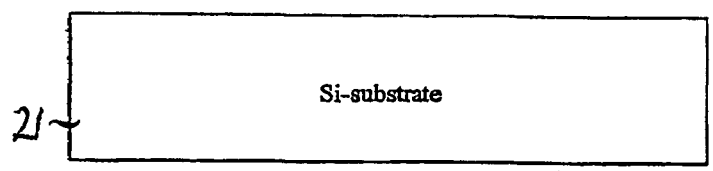

In FIG. 2a the starting material is shown which is a silicon substrate or wafer 21 having a <100> oriented surface. It is assumed that some electrical isolation, not shown, of the considered area of the substrate, using well-known processes like LOCOS, STI etc., has already been produced and that substrate/well-dopings, not shown, have been formed. FIGS. 2a–2g all show only the gate/source/drain area of an n-device or NMOS.

Since silicon n-devices are faster than p-devices because the mobility of electrons is higher than that of holes, n-devices are mostly used for high-frequency applications. For such a device, the substrate in the vicinity of the considered gate/source/drain region is medium doped and thus is of type p-silicon. A typical value of a doping with boron could be 1E16 $cm^{-3}$.

Figure 2B:
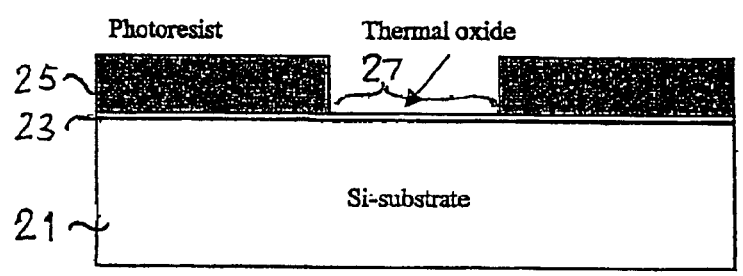

A first part of the gate oxide which is grown all over the considered region, i.e. also on the areas which are to be source and drain, is obtained by thermal oxidation of the silicon, see the oxide layer 23 in FIG. 2b. Thereupon a photoresist layer 25 is applied on top of the gate oxide layer and is by lithographic patterning made to only be left on those sections of the gate oxide that will be made thicker. The thickness of the first part of the gate oxide is in this example 40 Å.

Figure 2C:
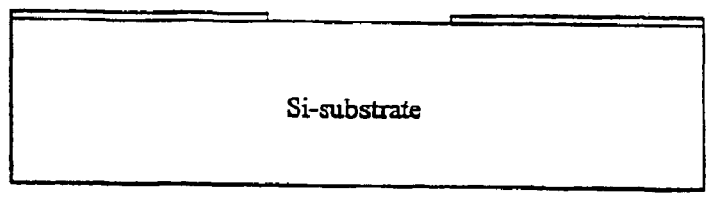

The oxide on the unprotected area 27 between the left portions of the photoresist layer is etched away, preferably by dry etching, and the photoresist layer 25 is removed, the result being seen in FIG. 2c.

Figure 2D:
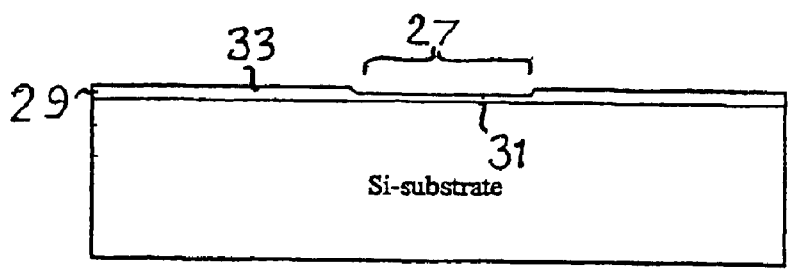

Thereafter, the oxide growth is continued to form more oxide over all of the considered area, producing an oxide layer 29 having two different thicknesses, see FIG. 2d, a thin layer 31 in the area 27 not protected by the mask 25 and a thicker layer 33 in the areas protected by the mask. For short oxidation times or equivalently thin oxides, the oxide thickness increases linearly with the processing time used, this region of oxidation being known as the linear rate region. For long oxidation times or thick oxides, the thickness instead increases as the square root of time period used, this region of oxidation being known as the parabolic rate region. For the thicknesses used in this example which are in the range of 80–120 Å, the thickness of the oxide is well within the "short" range. Hence, the thickness of the thick regions of the oxide layer is proportional to the sum of the oxidation times used. This would not be true for oxide thicknesses larger than about 300 Å. The step between the thin and thick regions is fairly smooth, because of the little difference in oxide thicknesses, and since a two-dimensional oxide growth is effected at the step.

Figure 2E:
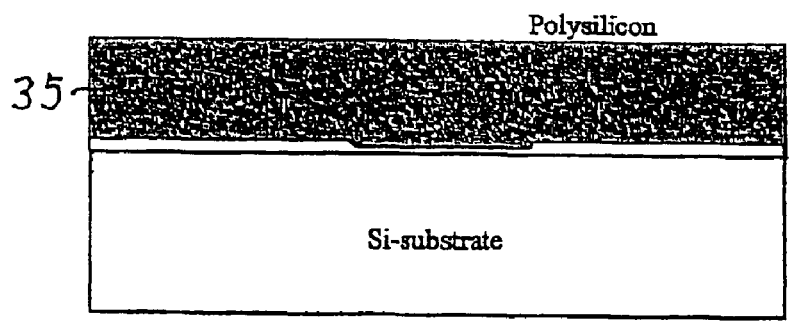

In the next processing step, see FIG. 2e, polysilicon is deposited as the material or layer 35 from which the gate will be formed. The thickness of the polysilicon layer is typically about 2500 Å.

Figure 2F:
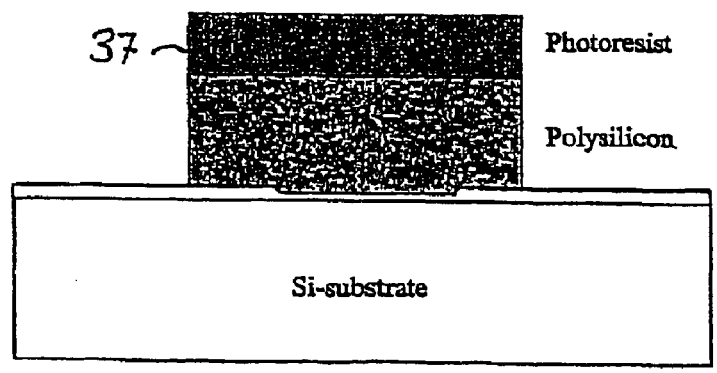

Thereafter, the gate is produced by applying and patterning a photoresist layer 37 as illustrated in FIG. 2f. Polysilicon not protected by the photoresist layer is removed by dry-etching down to the oxide.

Figure 2G:
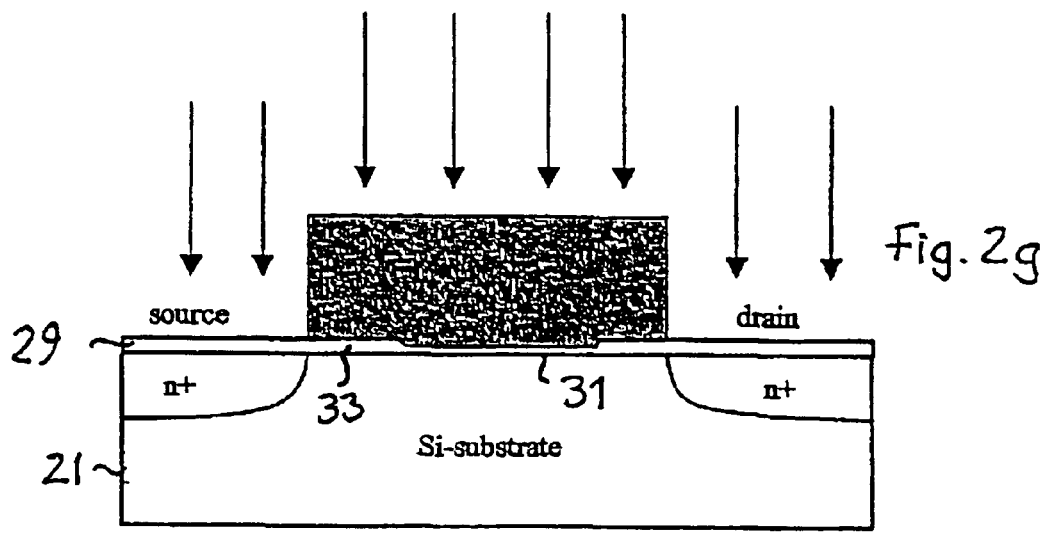

The photoresist 37 is then removed, and processing continues with the conventional steps of doping the gate, and formation of source and drains areas by ion implantation, see FIG. 2g.

In this way, a device having dual-gate oxide thickness has been obtained. The fairly smooth transition between the regions having different oxide thickness should be observed.

EXAMPLE 2

In a second example, the oxidation rate when producing the thermal gate oxide is enhanced or alternatively retarded by implanting species into the silicon before the final thermal oxidation. Thus for instance, ions, chosen from a group including chloride and bromine ions, are injected to selected areas at the surface of a silicon substrate to increase the oxidation rate of substrate in the implanted areas.

Figure 3:
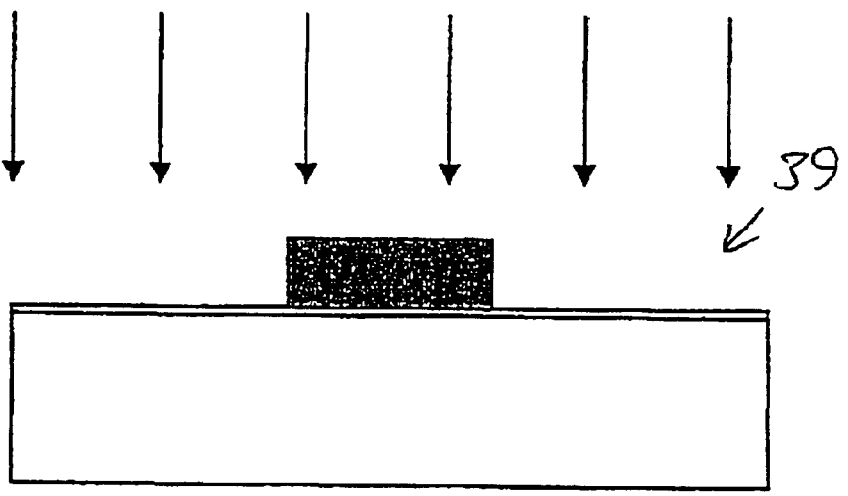
FIG. 3 is a schematic cross-sectional view of a structure in an intermediate stage when ion implantation of species to retard oxidation rate of the structure is made.

The steps of the process illustrated by FIGS. 2a-2g, when fabricating a device having two different gate oxide thicknesses using substantially the same parameters as in Example 1, are in this example changed by removing the step of etching a first oxide layer, performed after the step illustrated in FIG. 2b, and instead performing an implanting step illustrated by the schematic cross-sectional view of FIG. 3. In this step a region, which in the figure is an area 39 complementary to the area 27 of e.g. FIG. 2b and which is not covered by the photoresist 25, is implanted with an oxidation promoting material, e.g. chloride, to enhance the oxidation rate in the following oxidation step illustrated in FIG. 2d. Thus, instead of removing the oxide in some area of the device, the wafer is ion implanted.

Alternatively, if the material used in the implanting step is selected to retard the oxidation rate, such a nitrogen, the mask must have a pattern similar to that shown in FIG. 2b. The initial mask is also designed so that it always covers all other parts of the wafer surface during the ion implantation.

The continued processing of the structure after the step illustrated in FIG. 3 follows the same scheme as described in example 1, starting from FIG. 2d.

Other semiconductors than silicon as well as other devices that contain an MOS structure as a part of it like DMOS, MOS triggered thyristors etc. can also be produced using the same basic method as described above.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

We claim:

1. A method of fabricating a low noise MOS transistor at and/or in the surface of a substrate comprising the steps of, performed in any suitable order:

producing a gate oxide layer in a gate oxide region at/in the surface of the substrate and having a dual thickness comprising the substeps:

producing a first oxide layer over the surface of a substrate by thermal oxidation, covering the first oxide layer with a mask layer, patterning the mask layer to form at least one opening, ion implanting a material accelerating or retarding the oxidation of the material of the substrate through the first oxide layer in the opening, removing the mask, and continuing the thermal oxidation over the now exposed total surface of the first oxide layer, producing a gate located on top of the gate oxide layer, and producing a source and a drain located at/in the surface of the substrate and at sides of the gate oxide region.

2. The method according to claim 1, wherein the material used for ion implanting is an oxidation rate promoting material chosen from the group of chloride and bromine.

3. The method according to claim 2, wherein in the substep of patterning the mask layer openings are formed covering marginal regions of a gate region in which the gate is to be formed, a region inside the gate region being still covered with the mask layer.

4. The method according to claim 1, wherein the material used for ion implanting comprises nitrogen.

5. The method according to claim 4, wherein in the substep of patterning the mask layer an opening is formed inside a gate region in which the gate is to be formed, marginal regions of the gate region being still covered by the mask layer.

6. A method of fabricating a low noise MOS transistor at and/or in the surface of a substrate comprising the step of producing a dual thickness gate oxide layer with the steps:

producing a first oxide layer over the surface of a substrate by thermal oxidation, covering the first oxide layer with a mask layer, patterning the mask layer to form at least one opening, ion implanting a material accelerating or retarding the oxidation of the material of the substrate through the first oxide layer in the opening, removing the mask, and continuing the thermal oxidation over the now exposed total surface of the first oxide layer.

7. The method according to claim 6, further comprising the step of producing a gate located on top of the gate oxide layer.

8. The method according to claim 6, further comprising the step of producing a source and a drain located at/in the surface of the substrate and at sides of the gate oxide region.

9. The method according to claim 6, wherein the material used for ion implanting is an oxidation rate promoting material chosen from the group of chloride and bromine.

10. The method according to claim 9, wherein in the step of patterning the mask layer openings are formed covering marginal regions of a gate region in which the gate is to be formed, a region inside the gate region being still covered with the mask layer.

11. The method according to claim 6, wherein the material used for ion implanting comprises nitrogen.

12. The method according to claim 11, wherein in the step of patterning the mask layer an opening is formed inside a gate region in which the gate is to be formed, marginal regions of the gate region being still covered by the mask layer.

* * * * *